United States Patent
Unno et al.

(10) Patent No.: US 11,688,590 B2
(45) Date of Patent: Jun. 27, 2023

(54) ELECTROSTATIC-CHUCK HEATER

(71) Applicant: NGK INSULATORS, LTD., Nagoya (JP)

(72) Inventors: Yutaka Unno, Handa (JP); Reo Watanabe, Handa (JP)

(73) Assignee: NGK INSULATORS, LTD., Nagoya (JP)

(*) Notice: Subject to any disclaimer, the term of this patent is extended or adjusted under 35 U.S.C. 154(b) by 399 days.

(21) Appl. No.: 16/720,785

(22) Filed: Dec. 19, 2019

(65) Prior Publication Data

US 2020/0126773 A1  Apr. 23, 2020

Related U.S. Application Data

(63) Continuation of application No. PCT/JP2019/011762, filed on Mar. 20, 2019.

(Continued)

(51) Int. Cl.
*H01L 21/67*  (2006.01)
*H01L 21/683*  (2006.01)
(Continued)

(52) U.S. Cl.
CPC .... *H01J 37/32724* (2013.01); *C23C 16/4586* (2013.01); *C23C 16/45521* (2013.01);
(Continued)

(58) Field of Classification Search
CPC ......... H01J 37/32724; H01J 2237/2007; H01J 2237/3321; H01J 37/32715;
(Continued)

(56) References Cited

U.S. PATENT DOCUMENTS 5,777,838 A    7/1998  Tamagawa et al.
5,810,933 A *  9/1998  Mountsier ......... H01L 21/67109
                                                       118/728
(Continued)

FOREIGN PATENT DOCUMENTS

JP    H09-172055 A1   6/1997
JP    H09-232415      9/1997
(Continued)

OTHER PUBLICATIONS

English Machine translation of Asakura et al. (JP-2012234904-A) retrieved from ESPACENET Apr. 4, 2022 (Year: 2021).*
(Continued)

*Primary Examiner* — Ram N Kackar
*Assistant Examiner* — Laureen Chan
(74) *Attorney, Agent, or Firm* — Burr Patent Law, PLLC

(57) ABSTRACT

An electrostatic-chuck heater is of a Johnsen-Rahbek type and is used in a process of forming a conductive film on a wafer. The electrostatic-chuck heater includes a disc-shaped ceramic base including an electrostatic electrode and a heating resistor, and a hollow shaft attached to a side of the ceramic base that is opposite a side having a wafer-mounting surface. A through-hole extends in a peripheral wall of the hollow shaft from a lower end through to an area of the wafer-mounting surface that is on an inner side with respect to a circular groove. The through-hole allows gas to be supplied from the lower end of the hollow shaft into a below-wafer space enclosed by the wafer-mounting surface, an outermost projection group, and the wafer mounted on the wafer-mounting surface.

7 Claims, 8 Drawing Sheets

Related U.S. Application Data

(60) Provisional application No. 62/647,965, filed on Mar. 26, 2018.

(51) Int. Cl.

| | | |
|---|---|---|
| *C23C 16/458* | (2006.01) | |
| *C23C 16/455* | (2006.01) | |
| *H01J 37/32* | (2006.01) | |
| *C23C 16/46* | (2006.01) | |
| *C23C 16/50* | (2006.01) | |

(52) U.S. Cl.
CPC .............. *C23C 16/46* (2013.01); *C23C 16/50* (2013.01); *H01L 21/67103* (2013.01); *H01L 21/6833* (2013.01); *H01J 2237/2007* (2013.01); *H01J 2237/3321* (2013.01)

(58) Field of Classification Search
CPC .......... C23C 16/45521; C23C 16/4586; C23C 16/46; C23C 16/50; C23C 16/466; H01L 21/67103; H01L 21/6833; H01L 21/683; H01L 21/68785; H01L 21/68735; H01L 21/6875; H01L 21/6831; H01L 21/68792; B23Q 3/15; H02N 13/00
See application file for complete search history.

(56) References Cited

U.S. PATENT DOCUMENTS

| | | | |
|---|---|---|---|
| 6,063,202 A | 5/2000 | Cleary et al. | |
| 6,129,046 A * | 10/2000 | Mizuno | C23C 16/4585 118/728 |
| 6,179,924 B1 * | 1/2001 | Zhao | C23C 16/52 118/728 |
| 6,223,447 B1 | 5/2001 | Yudovsky et al. | |
| 6,377,437 B1 | 4/2002 | Sexton et al. | |
| 6,471,779 B1 * | 10/2002 | Nishio | C23C 16/455 118/724 |
| 6,558,508 B1 | 5/2003 | Kawakami | |
| 6,768,627 B1 | 7/2004 | Kitabayashi et al. | |
| 9,150,967 B2 | 10/2015 | Watanabe et al. | |
| 9,646,861 B2 | 5/2017 | Singh et al. | |
| 2002/0130276 A1 | 9/2002 | Sogard | |
| 2002/0159217 A1 * | 10/2002 | Tsuruta | C23C 16/4586 118/728 |
| 2003/0095370 A1 * | 5/2003 | Tsuruta | H01L 21/6833 361/234 |
| 2004/0218340 A1 | 11/2004 | Kitabayashi et al. | |
| 2005/0122503 A1 | 6/2005 | Ottens et al. | |
| 2005/0128444 A1 | 6/2005 | Ottens et al. | |
| 2005/0195382 A1 | 9/2005 | Ottens et al. | |
| 2006/0158822 A1 | 7/2006 | Kondo et al. | |
| 2006/0219176 A1 * | 10/2006 | Tomita | H01L 21/67109 118/725 |
| 2008/0037194 A1 * | 2/2008 | Kamitani | H02N 13/00 361/234 |
| 2009/0235866 A1 * | 9/2009 | Kataigi | H01L 21/6875 118/725 |
| 2010/0103584 A1 | 4/2010 | Nam | |
| 2013/0001899 A1 | 1/2013 | Hwang et al. | |
| 2013/0224675 A1 | 8/2013 | Park | |
| 2013/0284374 A1 | 10/2013 | Lubomirsky et al. | |
| 2014/0004702 A1 | 1/2014 | Singh | |
| 2019/0237353 A1 * | 8/2019 | Thomas | H01L 21/68792 |

FOREIGN PATENT DOCUMENTS

| | | |
|---|---|---|
| JP | 2000-332091 A1 | 11/2000 |
| JP | 2001-250816 A | 9/2001 |
| JP | 2002-222851 A1 | 8/2002 |
| JP | 2002-305238 A1 | 10/2002 |
| JP | 2004-022585 A | 1/2004 |
| JP | 2005-032858 A | 2/2005 |
| JP | 2005-145270 A1 | 6/2005 |
| JP | 2006-344766 A1 | 12/2006 |
| JP | 2008-166508 A | 7/2008 |
| JP | 2009-256789 A1 | 11/2009 |
| JP | 2010-010695 A1 | 1/2010 |
| JP | 2011-049196 A | 3/2011 |
| JP | 2011-258614 A | 12/2011 |
| JP | 2012234904 A * | 11/2012 |
| JP | 5324627 B2 | 10/2013 |
| JP | 2015-517224 A1 | 6/2015 |
| JP | 2017-212332 A1 | 11/2017 |
| KR | 10-2001-0080296 A | 8/2001 |
| KR | 10-2007-0050111 A | 5/2007 |
| KR | 10-2010-0046909 A | 5/2010 |
| KR | 10-2012-0103596 A | 9/2012 |
| KR | 10-2013-0098707 A | 9/2013 |
| WO | 2011/049620 A2 | 4/2011 |

OTHER PUBLICATIONS

Qin et al. Wafer dependence of Johnsen-Rahbek type electrostatic chuck for semiconductor processes. Sep. 17, 2007. Journal of Applied Physics. 102, 0064901 https://doi.org/10.1063/1.2778633 (Year: 2007).*

Shackelford, James F. Han, Young-Hwan Kim, Sukyoung Kwon, Se-Hun. (2015). CRC Materials Science and Engineering Handbook (4th Edition)—2.1 Physical Properties. Taylor & Francis. Retrieved from https://app.knovel.com/hotlink/pdf/id:kt0115E181/crc-materials-science/ceramics-physical-properties (Year: 2015).*

English translation of International Preliminary Report on Patentability (Chapter I) (Application No. PCT/JP2019/011762) dated Oct. 8, 2020, 13 pages.

Taiwanese Office Action, Taiwanese Application No. 108109994, dated Jun. 22, 2022 (6 pages).

International Search Report and Written Opinion (Application No. PCT/JP2019/011762) dated Jun. 18, 2019.

Korean Office Action (with English Translation), Korean Application No. 10-2019-7037329, dated May 9, 2023 (14 pages).

* cited by examiner

Fig. 9
Related Art
Fig. 10
Related Art
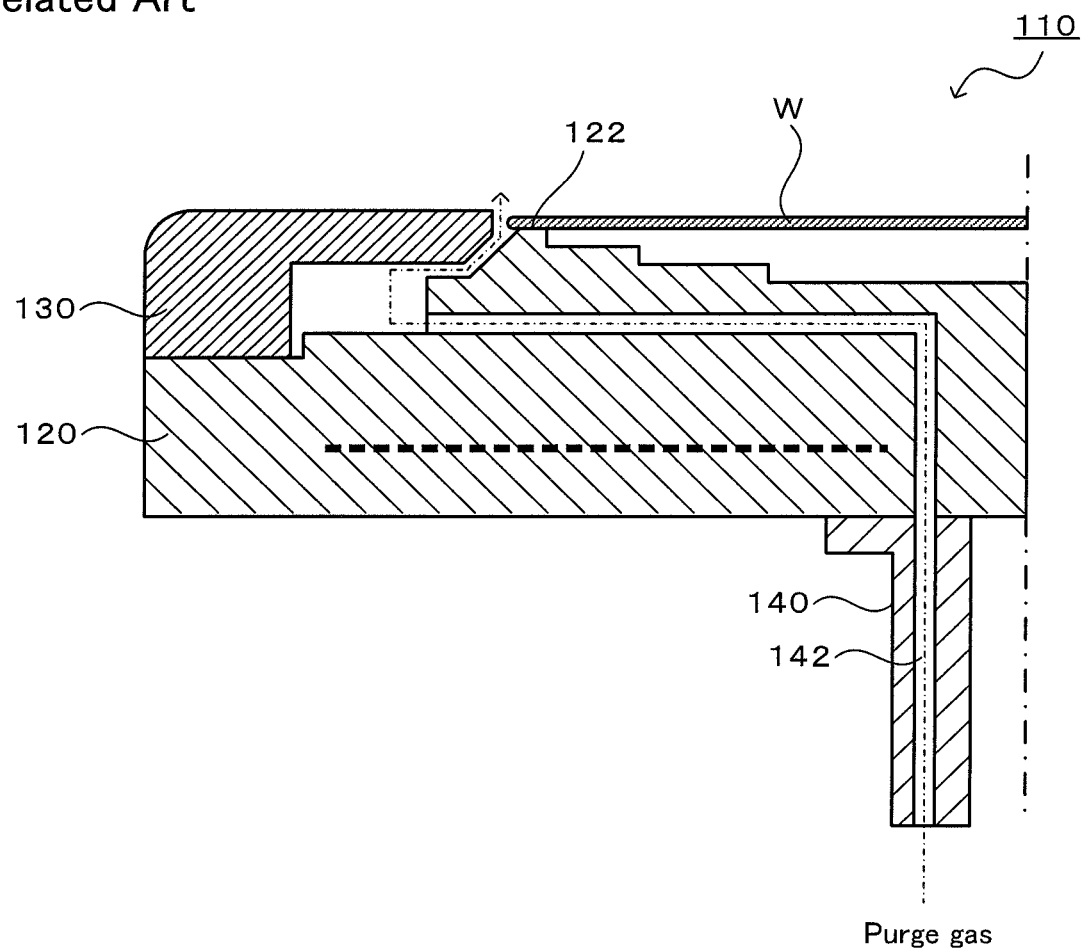
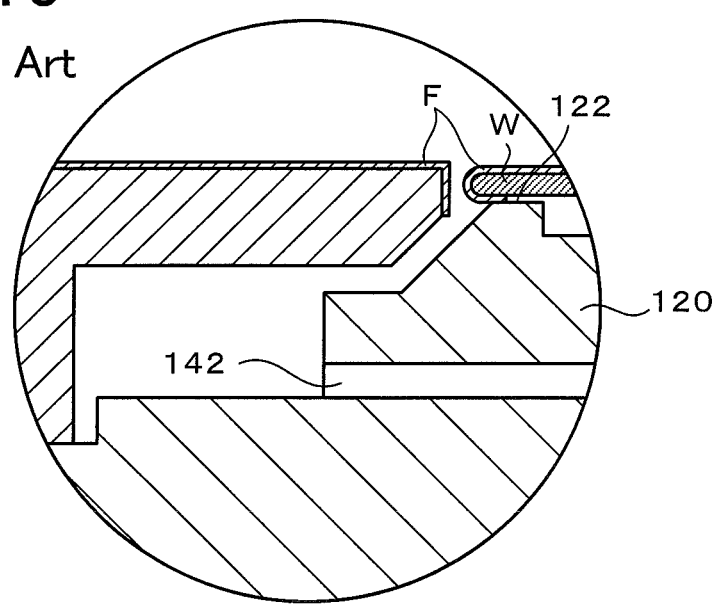

ELECTROSTATIC-CHUCK HEATER

The present application claims priority from U.S. provisional Patent Application No. 62/647,965 filed Mar. 26, 2018, the entire contents of which are incorporated herein by reference.

BACKGROUND OF THE INVENTION

1. Field of the Invention

The present invention relates to an electrostatic-chuck heater.

2. Description of the Related Art

Hitherto, wafer-supporting tables that support wafers have been known. For example, referring to FIG. 9, a wafer-supporting table 110 disclosed by PTL 1 includes a ceramic base 120 on which a wafer W is to be mounted, a hollow shaft 140 attached to a side of the ceramic base 120 that is opposite a side on which the wafer W is to be mounted, and a through-hole 142 extending from the lower end of the peripheral wall of the hollow shaft 140 through to an outer peripheral side face of the ceramic base 120. Purge gas supplied into the through-hole 142 is ejected from the outer peripheral side face of the ceramic base 120, passes through a space between the wafer W and a ring 130, and goes out of the space upward (see a one-dot-chain-line arrow in FIG. 9). In a process of forming a thin film on the upper surface of the wafer W by CVD, the purge gas prevents the formation of the thin film at the edge of the wafer W.

CITATION LIST

Patent Literature

PTL 1: JP No. 5324627 B

SUMMARY OF THE INVENTION

The purge gas flowing along the back surface of the wafer W at the outer peripheral edge of the wafer W flows from the outer side toward the inner side. Therefore, as illustrated in FIG. 10, a conductive film F formed on the upper surface of the wafer W by CVD may extend into a gap between a wafer-contact surface 122 of the ceramic base 120 and the wafer W. If the conductive film F extends into the gap between the wafer-contact surface 122 and the wafer W on the wafer-supporting table 110 having a function of attracting and holding the wafer W to the ceramic base 120 with a Johnsen-Rahbek force, the force of attraction may be reduced. Specifically, when a wafer W having undergone a CVD process is dismounted and is exchanged for a fresh wafer W, the fresh wafer W has the same potential as the wafer-contact surface 122 of the ceramic base 120 with the presence of the conductive film F. In such a case, only an unsatisfactory level of Johnsen-Rahbek force may be generated. Consequently, the force of attraction is reduced. Furthermore, the flow of the purge gas on the back surface of the wafer W may become nonuniform, which may affect the temperature uniformity of the wafer.

The present invention is to solve the above problems, and a main object of the present invention is to simultaneously realize stable chucking of a wafer and improved temperature uniformity of the wafer.

An electrostatic-chuck heater according to the present invention includes a Johnsen-Rahbek electrostatic-chuck heater to be used in a process of forming a conductive film on a wafer, a disc-shaped ceramic base having on one side a wafer-mounting surface on which the wafer is to be mounted, the ceramic base including an electrostatic electrode and a heating resistor; a hollow shaft attached to a side of the ceramic base that is opposite the side having the wafer-mounting surface; an outermost projection group including a plurality of projections provided in an annular area of the wafer-mounting surface and arranged on a circle that is concentric with the ceramic base, the annular area having an outside diameter smaller than a diameter of the wafer; a circular groove provided on an inner side with respect to the outermost projection group; and a through-hole extending in a peripheral wall of the hollow shaft from a lower end through to an area of the wafer-mounting surface that is on an inner side with respect to the circular groove, the through-hole allowing gas to be supplied from the lower end of the hollow shaft into a below-wafer space enclosed by the wafer-mounting surface, the outermost projection group, and the wafer mounted on the wafer-mounting surface.

The above electrostatic-chuck heater is used in a process of forming a conductive film on the surface of the wafer mounted over the plurality of projections included in the outermost projection group. In this process, the conductive film also adheres to an area of the wafer-mounting surface that is on the outer side with respect to the outermost projection group. Note that the outside diameter of the annular area in which the plurality of projections included in the outermost projection group are provided is smaller than the diameter of the wafer. Accordingly, in plan view, the projections are covered with the wafer. Therefore, the conductive film is less likely to adhere to the upper surfaces of the projections that are in contact with the back surface of the wafer. Furthermore, since the gas is supplied into the below-wafer space, a component that is to form the conductive film is less likely to flow into gaps between the wafer and the upper surfaced of the projections. In this respect as well, the conductive film is less likely to adhere to the upper surfaces of the projections. Therefore, when the formation of a conductive film on a wafer is completed and a fresh wafer is mounted over the upper surfaces of the plurality of projections included in the outermost projection group, the wafer comes into close contact with the upper surfaces of the projections to which no conductive film has adhered. Therefore, the wafer-chucking force, i.e. the Johnsen-Rahbek force, is maintained at the initial level. Accordingly, wafers can each be chucked stably throughout repeated processing. Furthermore, since the circular groove provided on the inner side with respect to the outermost projection group evens out the flow of the gas supplied from the through-hole, the wafer exhibits improved temperature uniformity.

In the electrostatic-chuck heater according to the present invention, the wafer-mounting surface may have a plurality of protrusions provided in the area on the inner side with respect to the circular groove and that are to come into contact with the wafer. In such a case, the area of contact between the wafer and the ceramic base is increased by the areas of the protrusions. Accordingly, the wafer-chucking force is increased. Thus, the wafer can be chucked more stably.

In the electrostatic-chuck heater according to the present invention, an opening of the through-hole in the wafer-mounting surface may be provided as a plurality of small holes having smaller diameters than the through-hole. In such a case, the gas flowing through the through-hole is dispersed before striking the back surface of the wafer. Therefore, the wafer can be chucked more stably and the reduction in the temperature of the wafer that is caused by the gas can be made smaller than in a case where the gas strikes the back surface of the wafer at one point.

In the electrostatic-chuck heater according to the present invention, a force with which the gas supplied into the below-wafer space pushes up the wafer may be smaller than a sum of a wafer-chucking force generated by energizing the electrostatic electrode and a force with which atmosphere above the wafer pushes down the wafer. In such a case, the wafer can be prevented from being lifted up by the gas supplied into the below-wafer space.

In the electrostatic-chuck heater according to the present invention, the electrostatic electrode may be used as a plasma electrode. If a high frequency is applied to the electrostatic electrode, the electrostatic electrode can be used as a plasma electrode. In such a case, the film can be formed by plasma CVD.

In the electrostatic-chuck heater according to the present invention, a radial groove connected to the circular groove may be provided on the inner side with respect to the circular groove. If such a radial groove is provided on the inner side with respect to the circular groove, the flow of the gas in the below-wafer space is more likely to be evened out. Therefore, the component that is to form the conductive film is much less likely to flow into the gaps between the wafer and the upper surfaces of the projections included in the outermost projection group.

In the electrostatic-chuck heater according to the present invention, an upper surface of each of the projections may have a surface roughness Ra of 1 μm or greater. In such a case, the gas in the below-wafer space flows from the center of the wafer over the rough upper surfaces of the projections included in the outermost projection group to the outer periphery. Such a flow makes it more difficult for the component that is to form the conductive film to flow into the gaps between the wafer and the upper surfaces of the projections.

In the electrostatic-chuck heater according to the present invention, the through-hole in the wafer-mounting surface may be open in both a central part and an outer peripheral part of the area on the inner side with respect to the circular groove. In such a case, the gas to be supplied into the below-wafer space is also ejected from the opening that is positioned in the outer peripheral part of the wafer-mounting surface and near the outermost projection group. Therefore, the component that is to form the conductive film is more easily prevented from flowing into the gaps between the wafer and the upper surfaces of the projections.

BRIEF DESCRIPTION OF THE DRAWINGS

FIG. 9 is a sectional view of a known wafer-supporting table 110.
FIG. 10 is a sectional view of part of the wafer-supporting table 110 in a state after the formation of a conductive film F.

DETAILED DESCRIPTION OF THE INVENTION

Figure 1:
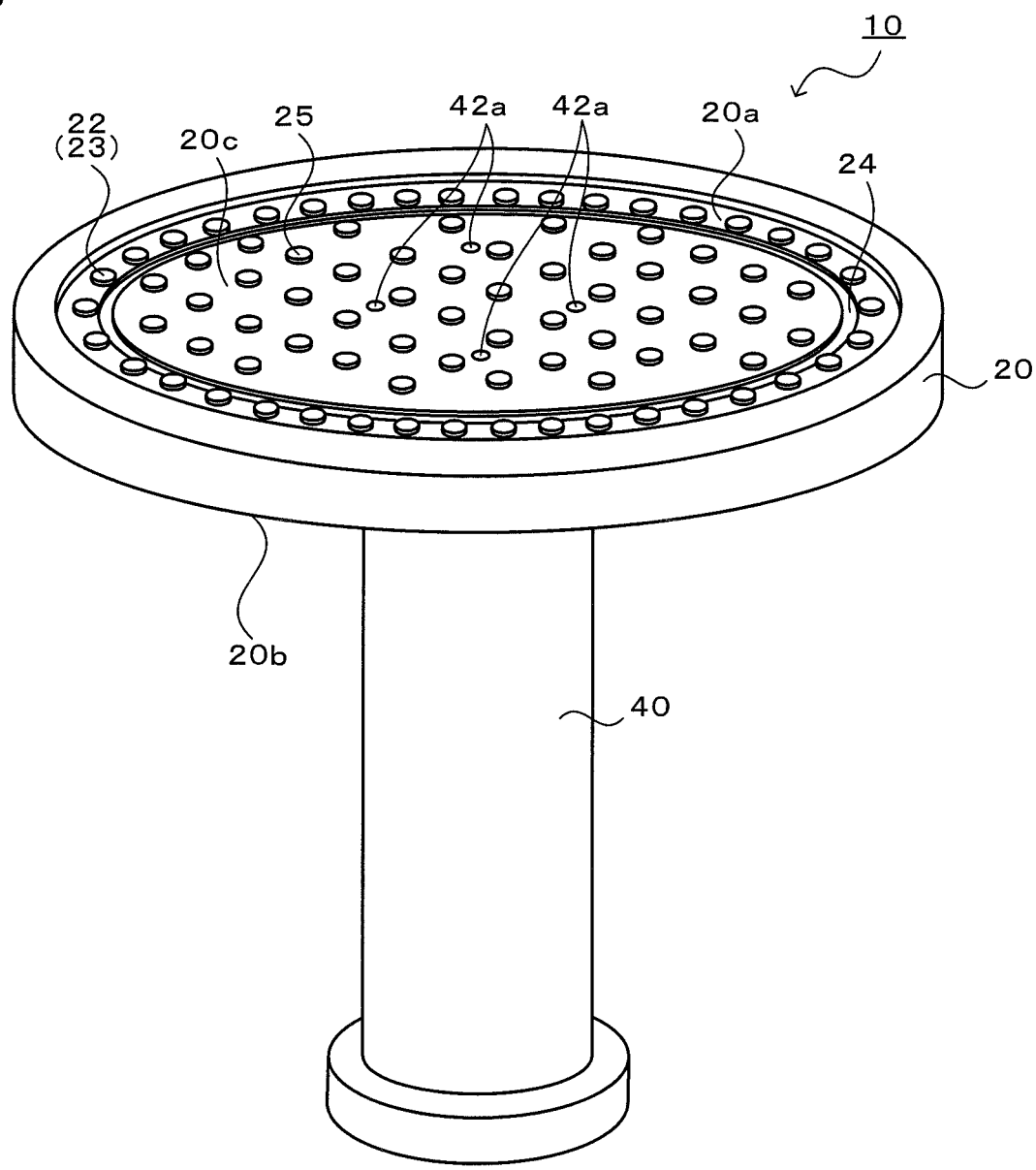
FIG. 1 is a perspective view of an electrostatic
Figure 2:
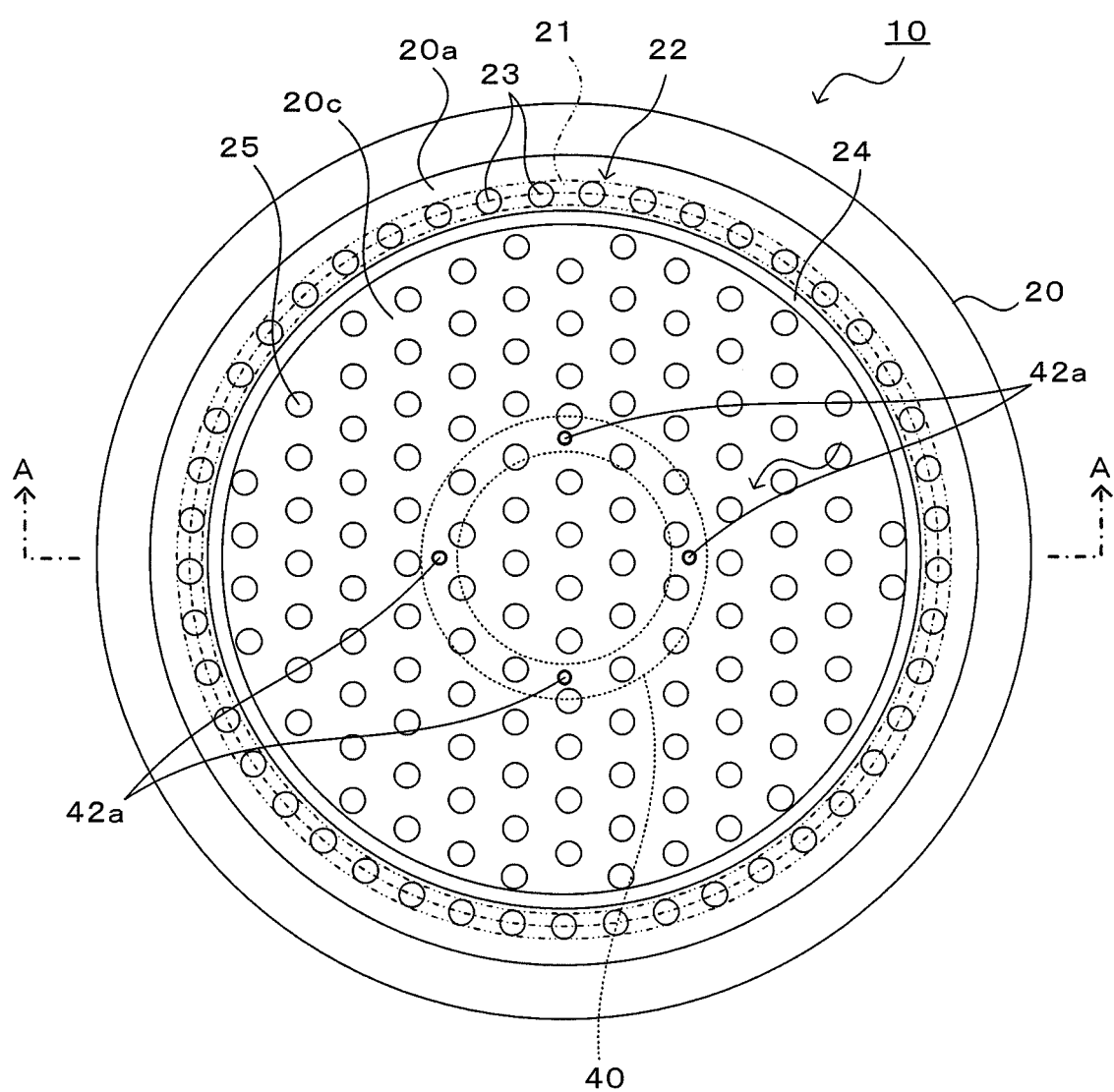
-
FIG. 2 is a plan view of the electrostatic-chuck heater 10.
Figure 3:
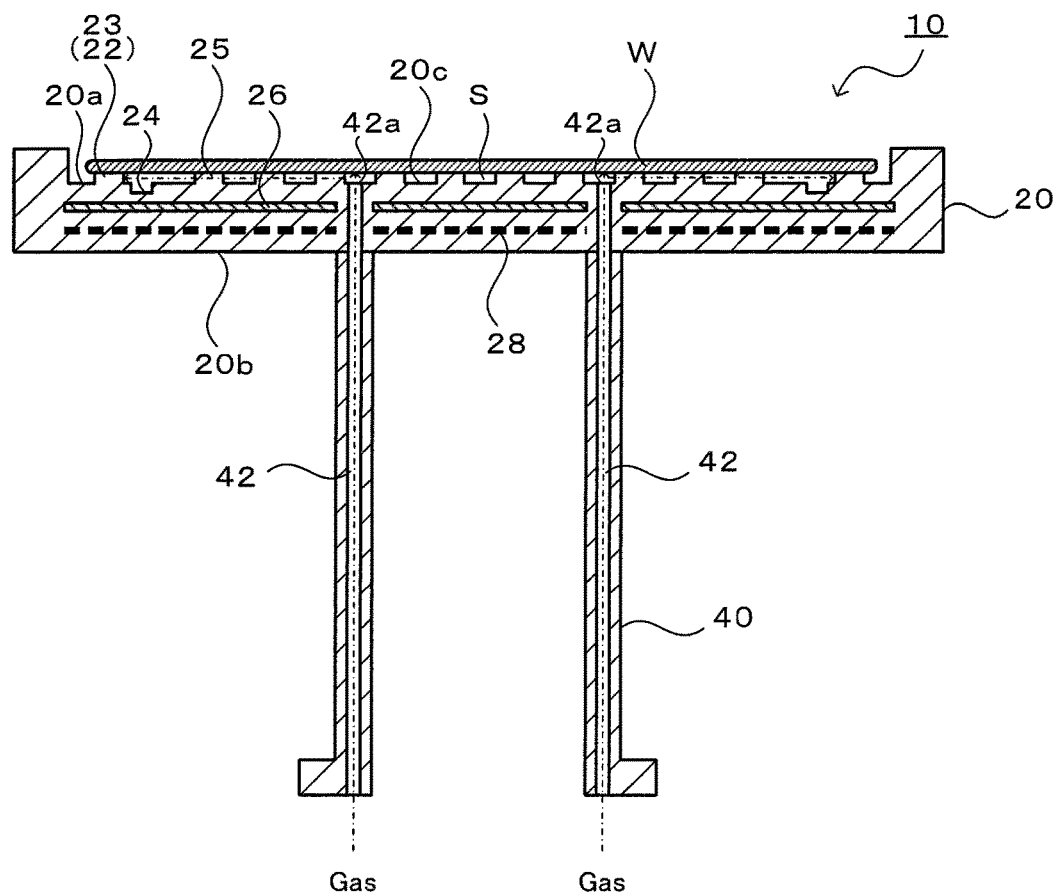
FIG. 3 is a sectional view taken along line A-A illustrated in FIG. 2.

A preferred embodiment of the present invention will now be described with reference to the drawings. FIG. 1 is a perspective view of an electrostatic-chuck heater 10. FIG. 2 is a plan view of the electrostatic-chuck heater 10. FIG. 3 is a sectional view taken along line A-A illustrated in FIG. 2.

The electrostatic-chuck heater 10 is used in a process of forming a conductive film on a wafer W by CVD or the like and includes a ceramic base 20 and a hollow shaft 40.

The ceramic base 20 is a disc made of aluminum nitride. The diameter of the ceramic base 20 is not specifically limited and may be, for example, about 300 mm. The ceramic base 20 has a wafer-mounting surface 20a on which the wafer W is to be mounted, and a back surface 20b that is opposite the wafer-mounting surface 20a. The ceramic base 20 has an outermost projection group 22 on the wafer-mounting surface 20a. The outermost projection group 22 includes a plurality of projections 23 arranged in an annular area 21 (an area defined between two-dot chain lines in FIG. 2) of the wafer-mounting surface 20a. The annular area 21 is defined concentrically with the ceramic base 20 and has an outside diameter smaller than the diameter of the wafer W. The plurality of projections 23 each have a flat round columnar shape and are formed integrally with the ceramic base 20. The projections 23 each preferably have a diameter of 1 mm or greater and 5 mm or smaller. The projections 23 each preferably has a height of 10 μm or greater and 30 μm or smaller. The projections 23 are preferably arranged at a pitch (the distance between the centers of adjacent ones of the projections 23) of 5 mm or greater and 10 mm or smaller. The wafer-mounting surface 20a has a circular groove 24 provided immediately on the inner side with respect to the outermost projection group 22. The circular groove 24 preferably has a width of 2 mm or greater and 5 mm or smaller. The circular groove 24 preferably has a depth of 50 μm or greater and 100 μm or smaller. The wafer-mounting surface 20a further has a large number of flat round columnar protrusions 25 arranged at intervals in an area (a circular-groove-enclosed area) 20c on the inner side with respect to the circular groove 24. The protrusions 25 in combination with the projections 23 included in the outermost projection group 22 support the wafer W by coming into contact with the back surface of the wafer W. The protrusions 25 may have the same shape and size as the projections 23. The projections 23 and the protrusions 25 can be formed by, for example, embossing.

The ceramic base 20 is provided with an electrostatic electrode 26 and a heating resistor 28 embedded therein. The electrostatic electrode 26 is a circular thin electrode having a slightly smaller diameter than the ceramic base 20 and is made of, for example, thin metal wires woven into a mesh sheet. The electrostatic electrode 26 is connected to a power-feeding bar, not illustrated. The power-feeding bar is connected to an external power source, not illustrated, through a space inside the hollow shaft 40. When a voltage is applied to the electrostatic electrode 26 from the external power source, the wafer W mounted on the wafer-mounting surface 20a is chucked. The chucking force generated in this case is a Johnsen-Rahbek force, because the volume resistivity of aluminum nitride forming the ceramic base 20 is $1\times10^8$ to $1\times10^{13}$ Ωcm. The heating resistor 28 is a coil of conductive wire extending in a single continuous line over the entirety of the ceramic base 20. Two ends of the heating resistor 28 are each connected to a power-feeding bar, not illustrated. The power-feeding bar is connected to a heater power source, not illustrated, through the space inside the hollow shaft 40. The heating resistor 28 generates heat when supplied with power from the heater power source, thereby heating the wafer W mounted on the wafer-mounting surface 20a. The heating resistor 28 is not limited to a coil and may be, for example, a ribbon (a long, narrow, thin strip) or a mesh.

The hollow shaft 40 is made of aluminum nitride, as with the ceramic base 20. The upper end face of the hollow shaft 40 is attached to the back surface 20b of the ceramic base 20 by solid-state bonding or diffusion bonding. The peripheral wall of the hollow shaft 40 has four through-holes 42 arranged at regular intervals in the peripheral direction. The through-holes 42 each extend vertically from the lower end of the hollow shaft 40 through to the circular-groove-enclosed area 20c of the ceramic base 20. The through-holes 42 are open at respective positions in the circular-groove-enclosed area 20c that are straightly above the peripheral wall of the hollow shaft 40. Openings 42a of the through-holes 42 are at respective positions in the circular-groove-enclosed area 20c that do not interfere with the protrusions 25. A gas source, not illustrated, is connected to the through-holes 42.

Now, an exemplary usage of the electrostatic-chuck heater 10 will be described. The electrostatic-chuck heater 10 is put into a CVD chamber, not illustrated, and a wafer W is mounted over the plurality of projections 23 included in the outermost projection group 22 and the large number of protrusions 25 provided in the circular-groove-enclosed area 20c. In this step, a space enclosed by the wafer-mounting surface 20a, the outermost projection group 22, and the wafer W is denoted as a below-wafer space S. When a voltage is applied to the electrostatic electrode 26, the wafer W is chucked with a Johnsen-Rahbek force. Furthermore, the temperature of the wafer W is obtained from a detection signal generated by a thermocouple, not illustrated, and the voltage to be applied to the heating resistor 28 is controlled to make the temperature of the wafer W a target temperature. Furthermore, gas is supplied into the through-holes 42 from the gas source. Examples of the gas include $N_2$, Ar, He, and so forth. The gas supplied into the through-holes 42 flows into the below-wafer space S from the openings 42a opening in the circular-groove-enclosed area 20c, and advances through the protrusions 25 toward the outer periphery (see one-dot chain lines in FIG. 3). The circular groove 24 evens out the flow of the gas. In this state, a conductive film F (see FIG. 4) is formed on the upper surface of the wafer W by CVD.

In the above process, the force with which the gas supplied into the below-wafer space S pushes up the wafer W is set to a value smaller than the sum of the wafer-chucking force generated by energizing the electrostatic electrode 26 and the force with which the atmosphere above the wafer W pushes down the wafer W. Therefore, the wafer W can be prevented from being lifted up by the gas supplied into the below-wafer space S.

Figure 4:
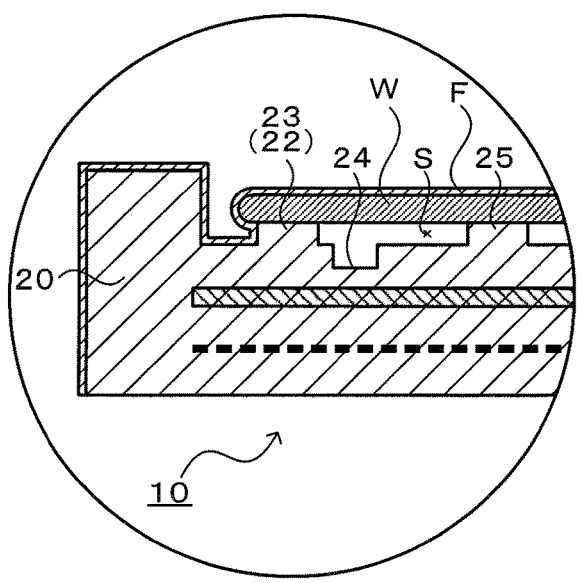
FIG. 4 is a sectional view of part of the electrostatic-chuck heater 10 in a state after the formation of a conductive film F.

When a conductive film F is formed on the surface of the wafer W, the conductive film F also adheres to part of the surface of the ceramic base 20 that is on the outer side with respect to the outermost projection group 22 (see FIG. 4). Note that the outside diameter of the annular area 21 in which the outermost projection group 22 is provided is smaller than the diameter of the wafer W. Accordingly, in plan view, the plurality of projections 23 included in the outermost projection group 22 are covered with the wafer W. Therefore, the conductive film F is less likely to adhere to the upper surfaces of the projections 23 that are in contact with the back surface of the wafer W. Furthermore, since the gas is supplied into the below-wafer space S, a component that is to form the conductive film F is less likely to flow into gaps between the wafer W and the projections 23. In this respect as well, the conductive film F is less likely to adhere to the upper surfaces of the projections 23.

In the process of forming a conductive film F on the surface of a wafer W by using the electrostatic-chuck heater 10 described above, the conductive film F is prevented from adhering to the upper surfaces of the plurality of projections 23 included in the outermost projection group 22. Therefore, when the formation of a conductive film F on a wafer W is completed and a fresh wafer W is mounted over the upper surfaces of the projections 23, the fresh wafer W comes into close contact with the upper surfaces of the projections 23 to which no conductive film F has adhered. Therefore, the Johnsen-Rahbek force is maintained at the initial level. Accordingly, wafers W can each be chucked stably throughout repeated processing. Furthermore, since the circular groove 24 provided on the inner side with respect to the outermost projection group 22 evens out the flow of the gas supplied from the through-holes 42, the wafer W exhibits improved temperature uniformity.

If the conductive film F adheres to the upper surfaces of any projections 23, cleaning is necessary for removing the conductive film F adhered to the upper surfaces of the projections 23. Such cleaning lowers production efficiency. In the present embodiment, the conductive film F does not adhere to the upper surfaces of the projections 23. Therefore, the above cleaning is not necessary, and improved production efficiency is realized.

Furthermore, the circular-groove-enclosed area 20c has the large number of protrusions 25 that are to come into contact with the wafer W. Therefore, the area of contact between the wafer W and the ceramic base 20 is increased by the areas of the protrusions 25. Accordingly, the wafer-chucking force is increased. Thus, the wafer W can be chucked more stably.

Furthermore, the force with which the gas supplied into the below-wafer space S pushes up the wafer W is set to a value smaller than the sum of the wafer-chucking force generated by energizing the electrostatic electrode 26 and the force with which the atmosphere above the wafer W pushes down the wafer W. Therefore, the wafer W can be prevented from being lifted up by the gas supplied into the below-wafer space S.

Needless to say, the present invention is not limited to the above embodiment in any way and can be embodied in various ways within the technical scope of the present invention.

For example, the above embodiment may be modified such that the upper surfaces of the plurality of projections 23 included in the outermost projection group 22 each have a surface roughness Ra of 1 μm or greater. In such a case, the gas in the below-wafer space S flows from the center of the wafer W over the rough upper surfaces of the projections 23 to the outer periphery. Such a flow of the gas makes it more difficult for the component that is to form the conductive film F to flow into the gaps between the wafer W and the upper surfaces of the projections 23.

Figure 5:
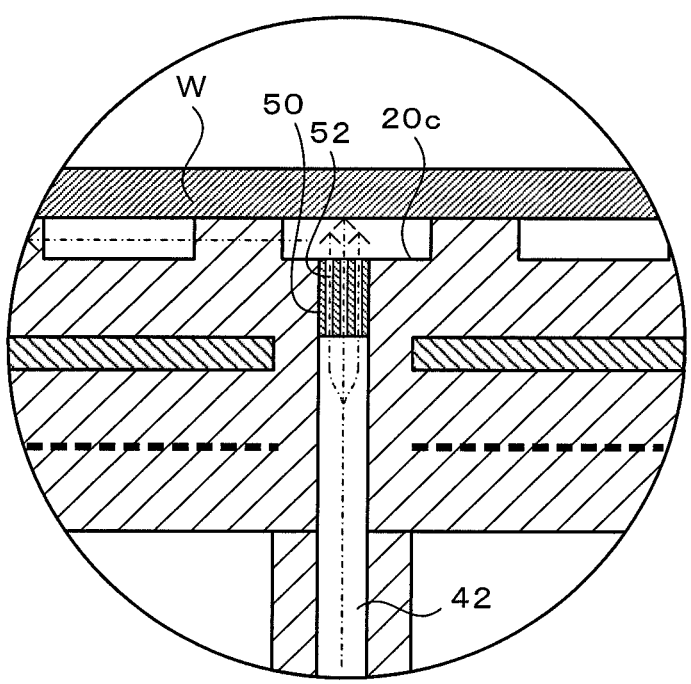
FIG. 5 is a sectional view of part of an electrostatic-chuck heater having a through-hole 42 provided with a plug 50.

The above embodiment may be modified such that, as illustrated in FIG. 5, the through-holes 42 provided in the circular-groove-enclosed area 20c of the wafer-mounting surface are each provided with a plug 50 fitted at the opening thereof, the plug 50 having a plurality of small holes 52 whose diameters are smaller than the diameter of the through-hole 42. In such a case, the opening of the through-hole 42 is provided as the plurality of small holes 52. Accordingly, the gas flowing through the through-hole 42 is dispersed into the small holes 52 before striking the back surface of the wafer W. Therefore, the wafer W can be chucked more stably and the reduction in the temperature of the wafer W that is caused by the gas can be made smaller than in a case where the gas concentratedly strikes the back surface of the wafer W.

Figure 6:
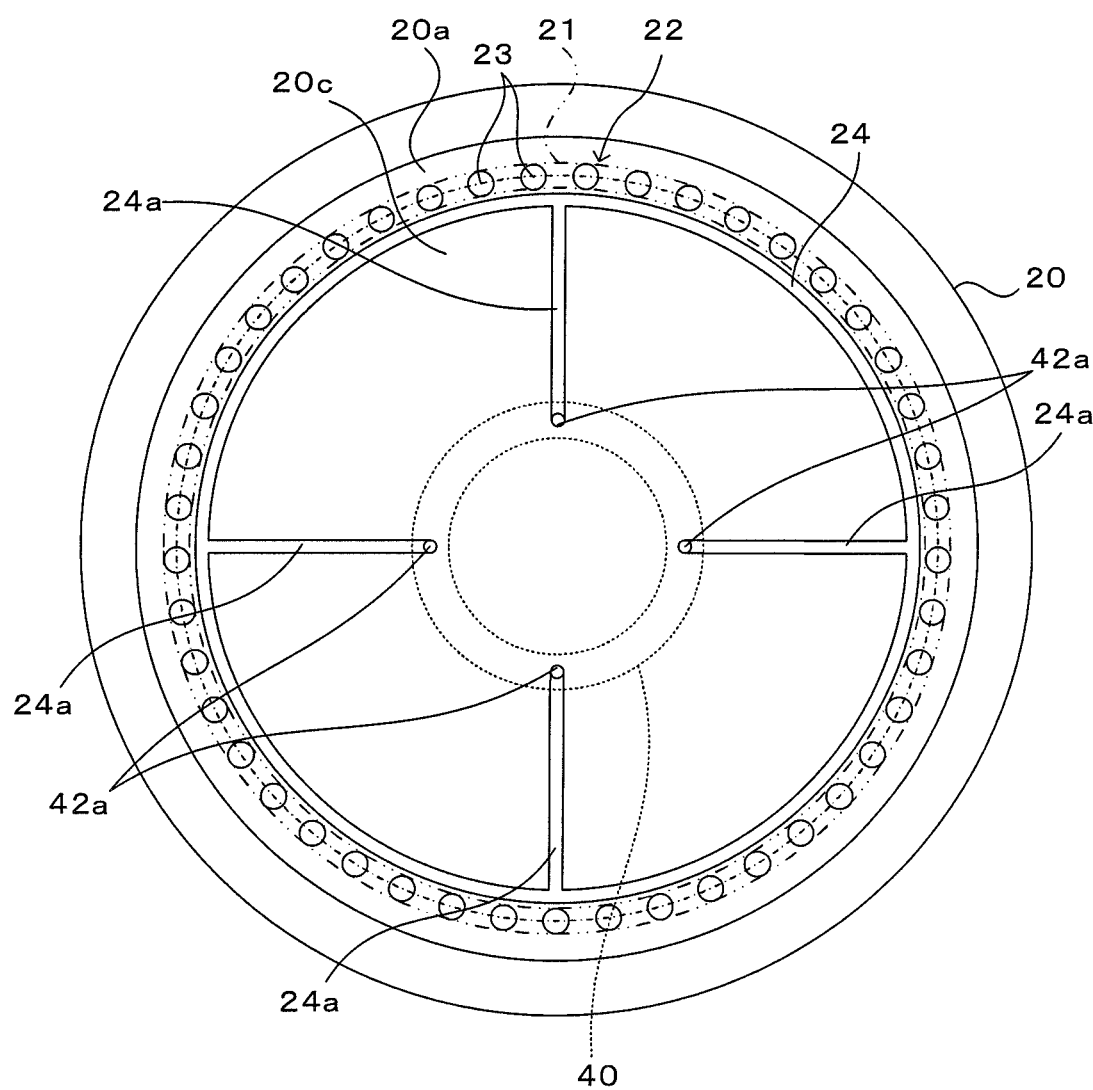
FIG. 6 is a plan view of an electrostatic-chuck heater having grooves 24a arranged radially in a circular-groove-enclosed area 20c.

The above embodiment may be modified such that, as illustrated in FIG. 6, the circular-groove-enclosed area 20c of the ceramic base 20 is provided with four grooves 24a arranged radially and connected to the openings 42a of the through-holes 42, respectively, with outer ends of the grooves 24a being connected to the circular groove 24. In FIG. 6, reference numerals that are the same as in the above embodiment denote elements that are common to the above embodiment, and the protrusions 25 are not illustrated. In such a modification, the flow of the gas in the below-wafer space is more likely to be evened out with the presence of the grooves 24a. Therefore, the component that is to form the conductive film is much less likely to flow into the gaps between the wafer and the plurality of projections 23 included in the outermost projection group 22.

Figure 7:
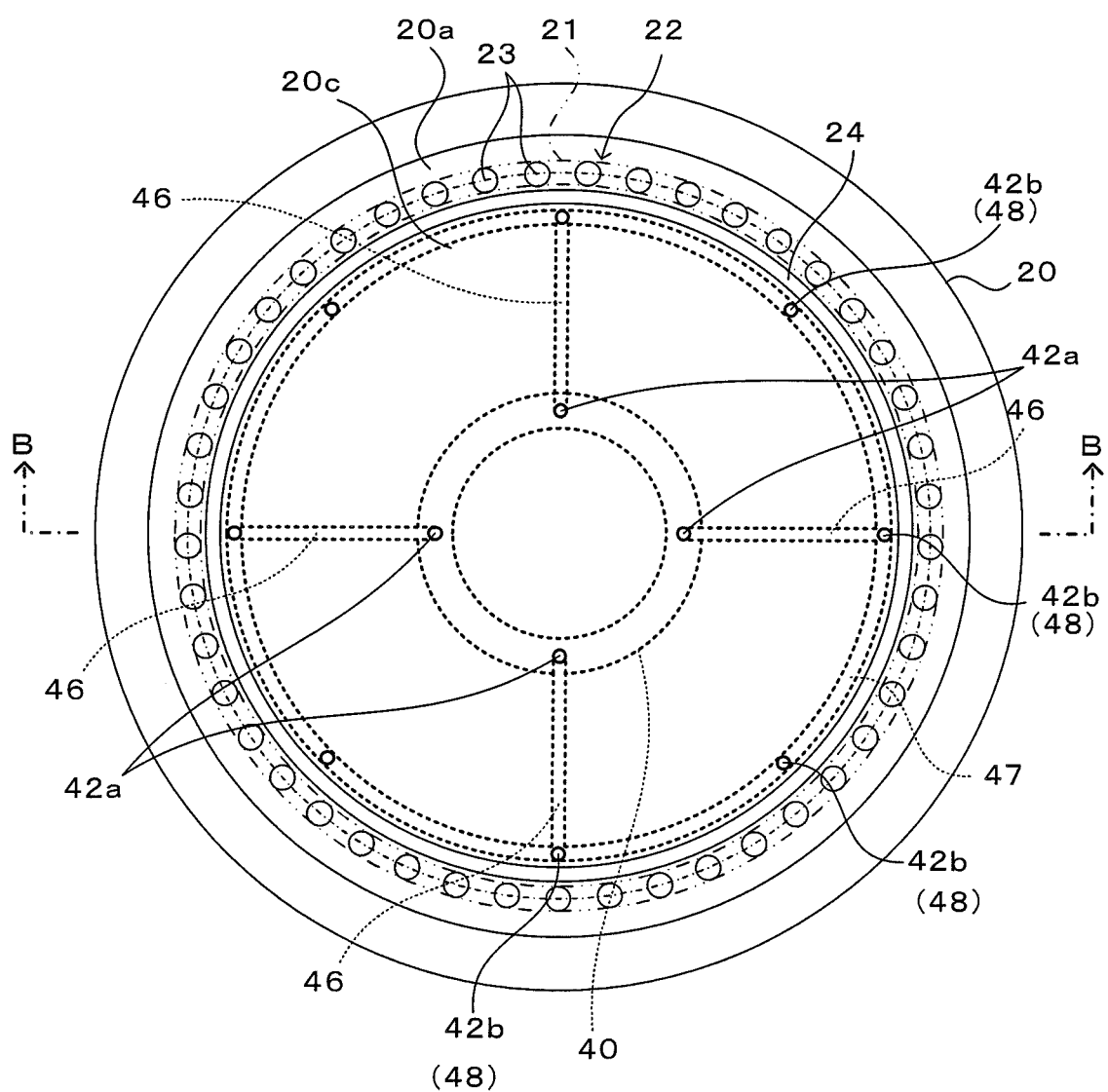
FIG. 7 is a plan view of an electrostatic-chuck heater having through-holes 42 each having openings 42a and 42b.
Figure 8:
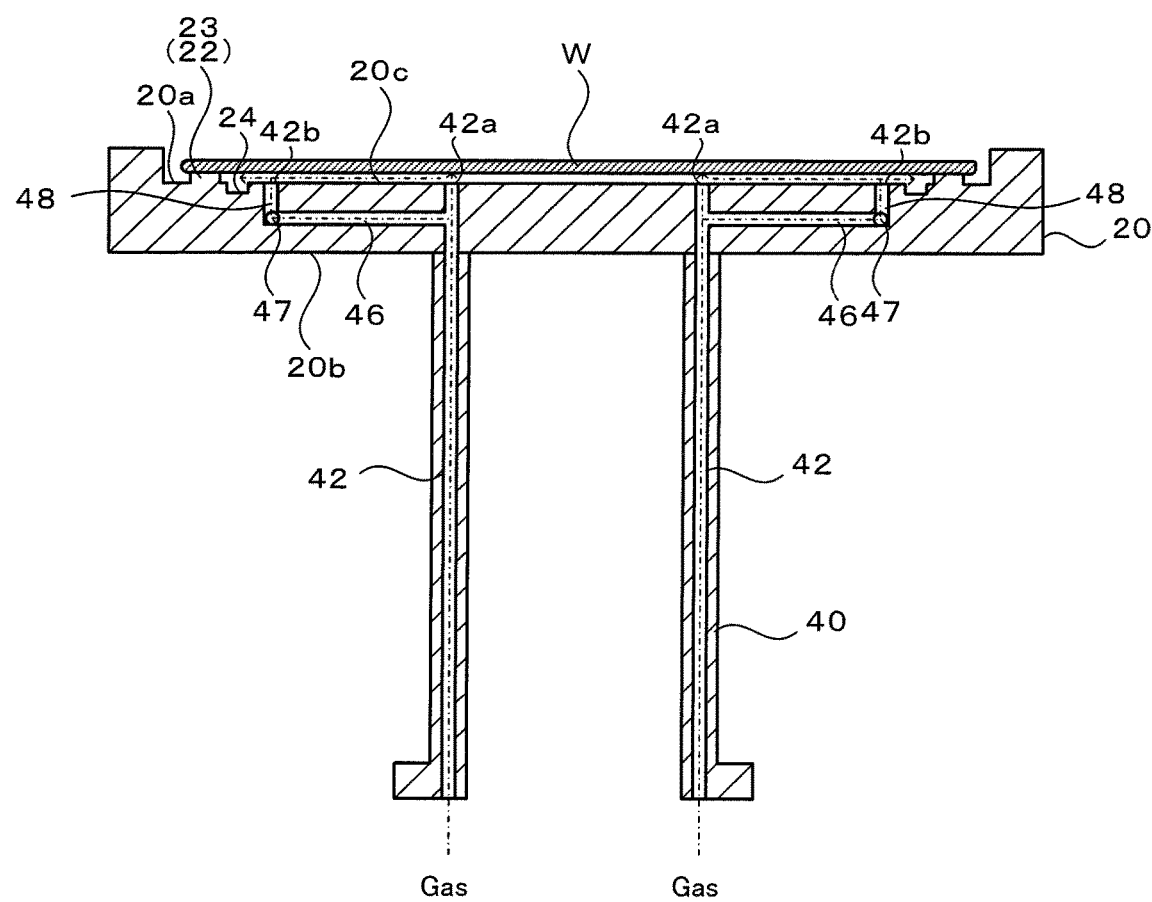
FIG. 8 is a sectional view taken along line B-B illustrated in FIG. 7.

The above embodiment may be modified such that, as illustrated in FIGS. 7 and 8, the through-holes 42 are provided with a plurality (four in this modification) of branches 46 each extending in a radial direction inside the ceramic base 20. In FIGS. 7 and 8, reference numerals that are the same as in the above embodiment denote elements that are common to the above embodiment, and the protrusions 25 are not illustrated. The branches 46 communicate with, at the outer ends thereof, a circular hole 47 provided concentrically with the ceramic base 20. The outside diameter of the circular hole 47 is slightly smaller than the inside diameter of the circular groove 24. The circular hole 47 communicates with a plurality (eight in this modification) of vertical holes 48 provided at regular intervals in the peripheral direction. The vertical holes 48 are open in the circular-groove-enclosed area 20c and adjacent to the circular groove 24. Accordingly, the through-holes 42 each have, in the wafer-mounting surface 20a, an opening 42a opening in a central part of the circular-groove-enclosed area 20c and an opening 42b (the opening of the vertical hole 48) opening in an outer peripheral part of the circular-groove-enclosed area 20c. In such a modification, the gas to be supplied into the below-wafer space S is also ejected from the openings 42b that are positioned near the outermost projection group 22. Therefore, the component that is to form the conductive film F is more easily prevented from flowing into the gaps between the wafer W and the outermost projection group 22.

The electrostatic electrode 26 according to the above embodiment may be used as a plasma electrode. If a high frequency is applied to the electrostatic electrode 26, the electrostatic electrode 26 can be used as a plasma electrode. In such a case, the film can be formed by plasma CVD.

While the above embodiment concerns a case where four through-holes 42 are provided in the peripheral wall of the hollow shaft 40 at regular intervals in the peripheral direction, the number of through-holes 42 is not limited to four and may be two, three, or five or more.

While the above embodiment concerns a case where a large number of protrusions 25 are provided in the circular-groove-enclosed area 20c, the protrusions 25 may be omitted. The protrusions 25 may be either provided or omitted in each of the modifications illustrated in FIGS. 5 to 8.

EXAMPLES

An electrostatic-chuck heater 10 according to the above embodiment was manufactured as Working Example 1, and another electrostatic-chuck heater that was the same as the electrostatic-chuck heater 10 but had no protrusions 25 in the circular-groove-enclosed area 20c was manufactured as Working Example 2. Specific dimensions of Working Examples 1 and 2 are summarized in Table 1.

TABLE 1

|  |  | Example 1 | Example 2 |
|---|---|---|---|
| Wafer | Diameter(mm) | 300 | 300 |
| Projection of an outermost projection group | PCD[X1](mm) | 293 | 293 |
|  | Diameter(mm) | 2.5 | 2.5 |
|  | Diameter(μm) | 20 | 20 |
|  | Pitch(mm) | 5 | 8 |
| Circular groove | Width(mm) | 3 | 3 |
|  | Diameter[X2](mm) | 282 | 282 |
|  | Depth(μm) | 60 | 60 |
| Protrusion of circular-groove-enclosed area | Diameter(mm) | 2.5 | — |
|  | Diameter(μm) | 20 | — |

[X1]Diameter of the pitch circle (one-dot chain line circle in FIG. 2)
[X2]Diameter of the circle at the center line of the circular groove A process of forming a conductive film F on the upper surface of a wafer W by CVD was performed continuously on 300 wafers W by using the electrostatic-chuck heaters according to Working Examples 1 and 2. The pressure (gas pressure) applied to the back surface of the wafer during wafer chucking was set to 10 torr, and the chamber pressure was set to 4 torr. As a result, in both of Working Examples 1 and 2, no conductive film F adhered to the upper surfaces of the plurality of projections 23 included in the outermost projection group 22, and the wafers W were chucked in a good manner throughout. On the other hand, an electrostatic-chuck heater that was the same as the electrostatic-chuck heater 10 but had no circular groove 24 was manufactured as Comparative Example, and the same process was performed. As summarized in Table 2, Working Examples 1 and 2 showed higher temperature uniformity of the wafer at an evaluation temperature of 550° C. than Comparative Example. The temperature uniformity of the wafer was represented by the difference between the highest temperature and the lowest temperature of the wafer as a whole that was controlled to have the evaluation temperature.

TABLE 2

|  | Example 1 | Example 2 | Working example |
|---|---|---|---|
| Temperature uniformity (Evaluation temperature 550° C.) | 3.6° C. | 3.9° C. | 5.4° C. |

What is claimed is:

1. A Johnsen-Rahbek electrostatic-chuck heater to be used in a process of forming a conductive film on a wafer, the electrostatic-chuck heater comprising:
- a disc-shaped ceramic base having on one side a wafer-mounting surface on which the wafer is to be mounted, the ceramic base including an electrostatic electrode and a heating resistor;
- a hollow shaft attached to a side of the ceramic base that is opposite the side having the wafer-mounting surface;
- an outermost projection group including a plurality of projections provided in an annular area of the wafer-mounting surface and arranged on a circle that is concentric with the ceramic base, the annular area having an outside diameter smaller than a diameter of the wafer;
- a circular groove provided on an inner side with respect to the outermost projection group;
- a plurality of through-holes extending in a peripheral wall of the hollow shaft from a lower end through to a central part of a circular-groove enclosed area of the wafer-mounting surface that is on an inner side with respect to the circular groove, each through-hole of the plurality of through-holes allowing gas to be supplied from the lower end of the hollow shaft into a below-wafer space enclosed by the wafer-mounting surface, the outermost projection group, and the wafer mounted on the wafer-mounting surface;
- a branch provided with each through-hole of the plurality of through-holes, extending from each of the respective through-holes in a radial direction inside the ceramic base;
- a circular hole provided inside the ceramic base concentrically with the ceramic base, communicating with the other end of the respective branch; and
- a vertical hole provided inside the ceramic base, arranged along the peripheral direction, communicating with the circular hole and opening in an outer peripheral part of the circular-groove-enclosed area that is on an inner side adjacent to the circular groove.

2. The electrostatic-chuck heater according to claim 1, wherein the wafer-mounting surface has a plurality of protrusions provided in the area on the inner side with respect to the circular groove and that are to come into contact with the wafer.

3. The electrostatic-chuck heater according to claim 1, wherein an opening of each through-hole of the plurality of through-holes in the wafer-mounting surface is provided as a plurality of small holes having smaller diameters than the through-hole.

4. The electrostatic-chuck heater according to claim 1, wherein a force with which the gas supplied into the below-wafer space pushes up the wafer is smaller than a sum of a wafer-chucking force generated by energizing the electrostatic electrode and a force with which atmosphere above the wafer pushes down the wafer.

5. The electrostatic-chuck heater according to claim 1, wherein the electrostatic electrode is used as a plasma electrode.

6. The electrostatic-chuck heater according to claim 1, wherein a radial groove connected to the circular groove is provided on the inner side with respect to the circular groove.

7. The electrostatic-chuck heater according to claim 1, wherein an upper surface of each of the projections has a surface roughness Ra of 1 µm or greater.

* * * * *